(12) United States Patent
Bult et al.

(10) Patent No.: US 7,545,296 B2
(45) Date of Patent: Jun. 9, 2009

(54) INTERLEAVED TRACK AND HOLD CIRCUIT

(75) Inventors: Klaas Bult, Bosch en Duin (NL); Frank van der Goes, The Hague (NL)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/843,341

(22) Filed: Aug. 22, 2007

(65) Prior Publication Data

US 2008/0094269 A1 Apr. 24, 2008

Related U.S. Application Data

(60) Provisional application No. 60/839,140, filed on Aug. 22, 2006.

(51) Int. Cl.
*H03M 1/12* (2006.01)
*G11C 27/02* (2006.01)

(52) U.S. Cl. .................... 341/122; 327/91; 327/94

(58) Field of Classification Search ............. 341/122, 341/155; 327/91, 94–96, 415–417
See application file for complete search history.

(56) References Cited

U.S. PATENT DOCUMENTS

| 4,404,479 | A  | * | 9/1983 | Toyomaki | .................. | 327/95 |
| 7,015,729 | B1 | * | 3/2006 | Tursi et al. | .................. | 327/94 |
| 2006/0055575 | A1 | * | 3/2006 | Van Tuijl | .................. | 341/155 |

FOREIGN PATENT DOCUMENTS

WO    WO 2004066504 A1 *  8/2004

OTHER PUBLICATIONS

Black, W.C. and Hodges, D.A., "Time interleaved converter arrays," IEEE Journal of Solid-State Circuits, vol. 15, Issue 6, pp. 1022-1029, Dec. 1980.
Elbornsson, J. et al., "Blind equalization of time errors in a time-interleaved ADC system," IEEE Transactions on Signal Processing, vol. 53, Issue 4, pp. 1413-1424, Apr. 2005.
Kurosawa, N. et al., "Explicit analysis of channel mismatch effects in time-interleaved ADC systems," IEEE Transactions on Circuits and Systems I: Fundamental Theory and Applications, vol. 48, Issue 3, pp. 261-271, Mar. 2001.
Leger, G. et al., "Impact of random channel mismatch on the SNR and SFDR of time-interleaved ADCs," IEEE Transactions on Circuits and Systems I: Regular Papers, vol. 51, Issue 1, pp. 140-150, Jan. 2004.
Lim, P.J. and Wooley, B.A., "A high-speed sample-and-hold technique using a Miller hold capacitance," IEEE Journal of Solid-State Circuits, vol. 26, Issue 4, pp. 643-651, Apr. 1991.

* cited by examiner

*Primary Examiner*—Howard Williams
(74) *Attorney, Agent, or Firm*—Sterne, Kessler, Goldstein & Fox, P.L.L.C.

(57) ABSTRACT

The invention relates to an interleaved track and hold circuit for tracking and holding a value of a continuous input signal and to provide discrete values thereof, wherein the circuit comprises a first and a second stage. To avoid tones caused by differences in the non-ideal elements when switching through several parallel second stages the circuit according to the invention comprises a single first stage and at least two second stages.

16 Claims, 15 Drawing Sheets

INTERLEAVED TRACK AND HOLD CIRCUIT

CROSS-REFERENCE TO RELATED APPLICATIONS

This application claims benefit to U.S. Provisional Application No. 60/839,140, filed Aug. 22, 2006, which is incorporated by reference herein in its entirety.

FIELD OF THE INVENTION

The invention generally relates to electrical circuits, in particular, interleaved track and hold circuits, and methods for processing a signal.

BACKGROUND OF THE INVENTION

A track-and-hold amplifier circuit, which may be also called sample-and-hold amplifier circuit, for example may be used to interface a continuously changing analog signal to a subsequent circuit such as an analog-to-digital converter (ADC). The purpose of the track-and-hold amplifier circuit is to hold the analog value steady for a short time while the subsequent analog-to-digital converter or any other subsequent circuit performs some operation, i.e. for example to sample the value of the analog signal, which takes a little time.

Track and hold amplifier circuits and successive analog to digital converters are the most dominant blocks in an analog front end, because they are hard to design, dominant in power consumption and thus require most of the design time.

Various concepts of track and hold amplifier circuits have been discussed in the prior art, such as in W. Black and D. Hodges, "Time Interleaved converter arrays", IEEE Journal of solid-state circuits, Vol. SC-15, No. 6, pp. 1022-1029, December 1980, or N. Kurosawa et al., "Explicit Analysis of Channel Mismatch Effects in Time-Interleaved ADC Systems", IEEE Journal of Solid-state Circuits, Vol. 48, No. 3, pp. 261-271, March 2001, or G. Leger et al., "Impact of Random Channel Mismatch on the SNR and SFDR of Time-Interleaved ADCs", IEEE Journal of Solid-State Circuits, Vol. 51, No. 1, pp. 140-150, January 2004, or J. Elbornsson et al., "Blind Equalization of Time Errors in a Time-Interleaved ADC System", IEEE Transactions on Signal Processing, Vol. 53, No. 4, pp. 1413-1424, April 2005, or P. Lim and B. Wooley, "A High-Speed Sample-and-Hold Technique Using a Miller Hold Capacitance", IEEE Journal of Solid-State Circuits, Vol. 26, No. 4, pp. 643-651, April 1991.

The principles and in particular the problem underlying the current invention will be explained in the following examples of prior art.

FIG. 1A depicts the schematics of a conventional closed-loop track-and-hold amplifier (THA) circuit 100 comprising a first and a second stage 110, 120. The first stage 110 comprises an operational amplifier 130 receiving an input voltage Vin at its negative input. The amplifier's output is coupled to the second stage 120, which is adapted to hold a value—of the input signal—for a period of time. In this example the second stage comprises an inverter 140 outputting an output signal Vout and a Miller capacitor 150 coupled between in- and output of the inverter 140 is used to store the analog value. Feedback path 160 couples the output signal Vout to the non-inverting input of the operational amplifier 130. A first and a second switch 170, 171 are arranged in the feedback path 160 and between the operational amplifier and the inverter respectively.

Switches 170, 171 are switching synchronously according to a clock signal φ1 shown in FIG. 1B. The clock signal toggles between a low state and a high state thus clocking the switches 170, 171 to close and to open accordingly. Both switches 170, 171 close when the clock signal φ1 exceeds a voltage Vthreshold and accordingly open when the clock signal drops below the threshold voltage. When the switches are closed the output signal Vout tracks the input signal and the capacitor 150 is charged to the voltage of the output signal. When both switches are open the capacitor holds the voltage of the output signal steady until the switches are closed again. Accordingly the output signal tracks or in other words follows the input signal when the clock signal exceeds the threshold voltage and holds the voltage of the output signal when the clock signal drops below the threshold voltage.

The dotted line in FIG. 1C illustrates an input signal 180 as a function of time, which in this example is a sinusoidal, continuous signal. Output signal 190 as output from track-and-hold circuit 100 follows the input signal during track intervals denoted with T, such that the massive line denoting output signal 190 matches and thus covers the dotted line of input signal 180 in track intervals. When the switches 170, 171 are open, that is during hold intervals denoted with H, then the output signal is kept constant, hence the signals differ. As soon as the switches are closed again, the output signal 190 jumps to follow the input signal 180, so that there are jumps or stairs 171 in the signal waveform at transitions from hold to track intervals.

The track-and-hold circuit shows good and accurate tracking of the input signal due to the feedback path 160, as long as there is sufficient loop gain at the frequency of interest. As switch 171, which is the sampling switch, is located at a point in the circuit with little signal swing, the on-resistance and channel charge show very little dependence from the input signal and hence will not cause considerable distortion of the output signal. However the circuit holds the amplitude value of the input signal only during hold intervals, i.e. only during half of the time.

FIG. 2A depicts a circuit 200 as known from prior art comprising a first and a second identical track-and-hold branch 210, 220 in parallel having similarities to the circuit discussed above. The branches each comprise a first and a second stage, wherein the first stages are each coupled to the input signal Vin and the output signals Vo1 and Vo2 of branches 210, 220 are coupled via switches 230, 231 to form a single output signal Vout.

FIG. 2B depicts clock signals φ1 and φ2 which are similar to the clock signal of FIG. 1C and interleaved in time by one half clock cycle. Accordingly clock signal φ1 is in its high state when φ2 is low and vice versa. The switches of 210 and switch 231 are clocked by clock signal φ1 and switches of 220 as well as switch 230 are clocked by φ2 accordingly. Thus branches 210, 220 are clocked with different phases of the two non-overlapping clock signals φ1 and φ2, hence interleaving the branches 210 and 220 in time. That is, as is apparent from the clock signals φ1 and φ2, branch 210 is in hold mode and its output is coupled via switch 230 to the overall output while branch 220 is in track mode and decoupled from the overall output Vout. Subsequently and when the clock signals toggle the output of branch 220 is coupled to the overall output while the output of branch 210 is decoupled from overall output signal Vout.

The massive line in FIG. 2C depicts the resulting overall output signal Vout 260 as a function of time, while the input signal Vin 250 is shown as the dotted line. The output signal Vout has been constructed from the output of branches 210, 220 by switching the switches 230, 231 appropriately to interleave the output signals Vo1 and Vo2 during their individual hold interval. As shown in the drawing output signal Vout now consists of stairs being discrete values connected by signal jumps, wherein each stair is a value of one of the circuits 210, 220 during its individual hold interval.

The number of discrete values is defined by the frequency of the clock signals, wherein a higher clock frequency, which is the sampling frequency Fs, causes more discrete values per time. The output signal will thus follow the input more closely.

The circuits 210, 220 furthermore comprise offset voltages, wherein the effective offset voltages of the circuits are dominated by the offset voltages of the input stages, i.e. Voff1 and Voff2. The offset voltages Voff12 and Voff22 of the second amplifiers or inverters respectively are suppressed by the loop-gain.

However due to fabrication tolerances the operational amplifiers have different offset voltages. When cycling through the parallel track-and-hold branches the different offset voltages cause tones at a frequency of Fs/N, with Fs being the sampling frequency and N being the number of parallel branches, because for each sampling interval the next of the parallel branches having its own offset voltage is coupled to the output.

A second problem is caused by the individual gain-errors of the parallel branches, which produce tones at Fs/N+Fin and Fs/N−Fin, with Fin being the frequency of interest.

In particular with increasing N this tone will be in the signal band of interest and thus will degrade the signal to noise ratio (SNR) of the circuit and ultimately the Effective Number of Bits (ENOB) of the Analog Front End. With offset voltages in the order of millivolts and signal swings in the order of several hundreds of millivolts, this will put an upper limit around 45 dB to 50 dB for the SNR of the analog front end, thus limiting the ENOB to 7 or 8 bits at the output of an analog to digital converter.

Accordingly there is a need for a track and hold amplifier avoiding the above mentioned tones.

BRIEF SUMMARY OF THE INVENTION

A circuit and/or method are provided, substantially as shown in and/or described in connection with at least one of the figures, as set forth more completely in the claims.

Further features and advantages of the present invention will become apparent from the following detailed description of embodiments of the invention made with reference to the accompanying drawings.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

Figure 1A:
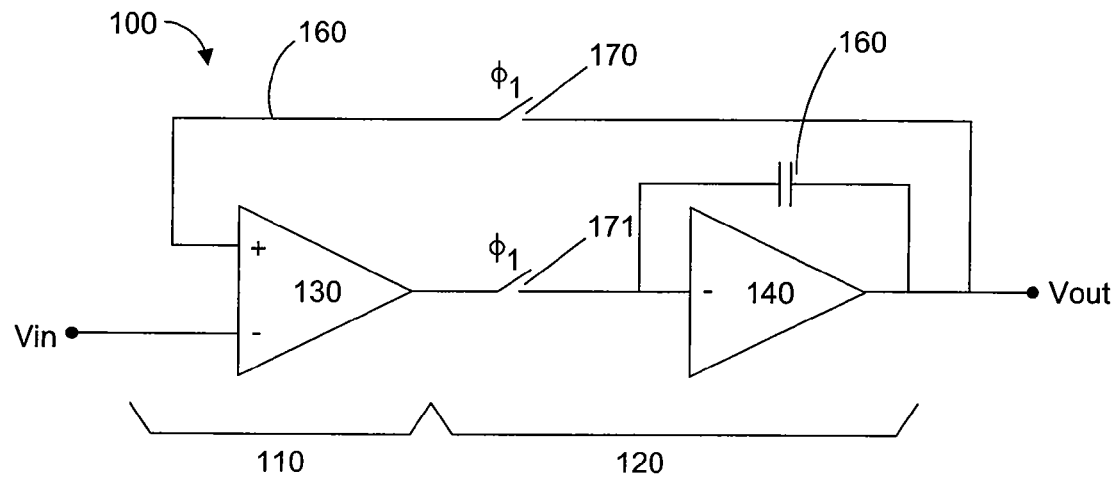
FIG. 1A depicts a track-and-hold circuit known from prior art.
Figure 1B:
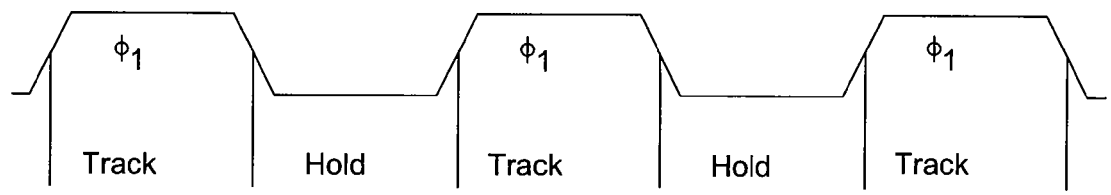
FIG. 1B shows a timing diagram of the clock signal.
Figure 1C:
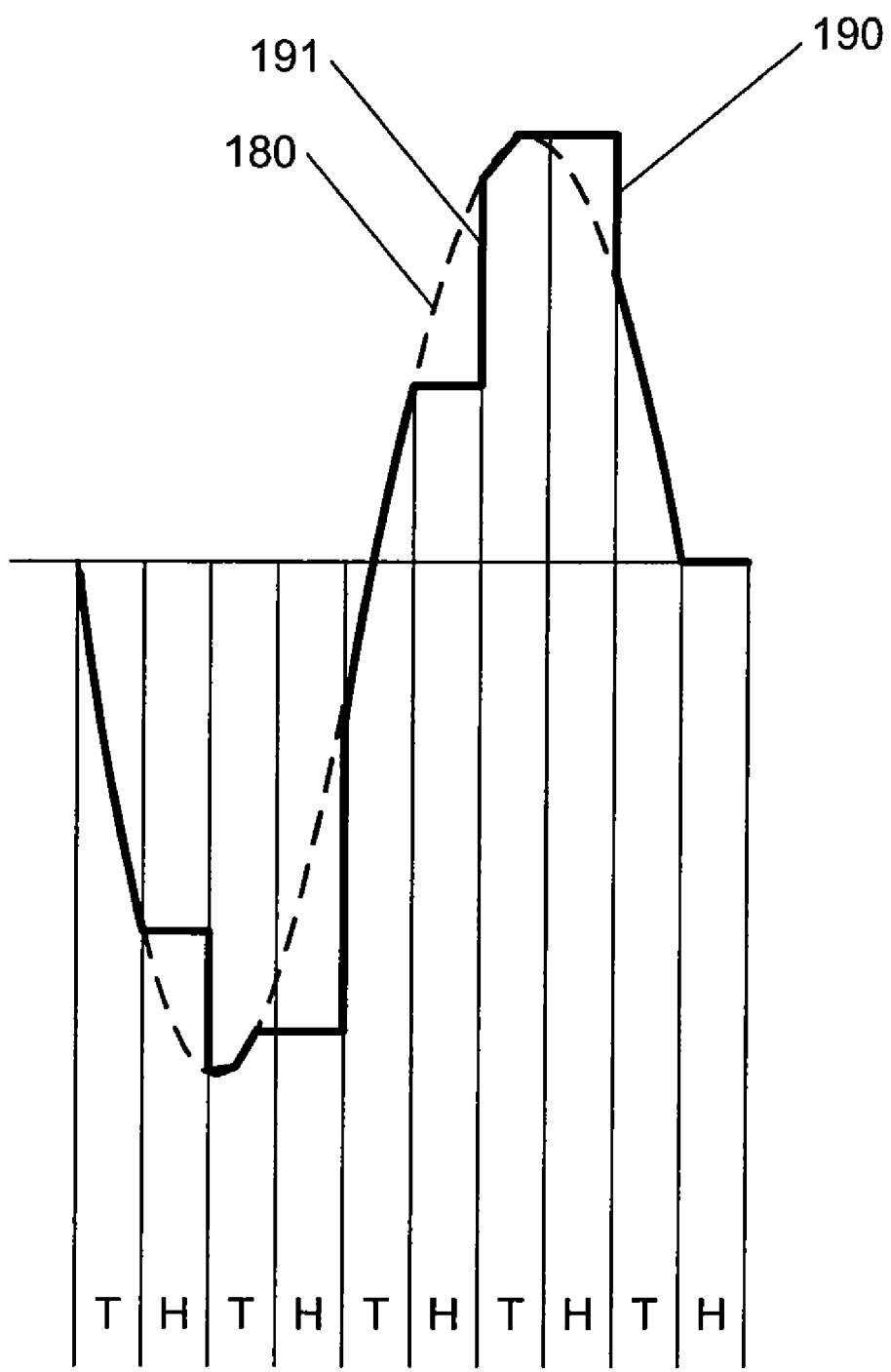
FIG. 1C illustrates the in- and respective output signal.
Figure 2A:
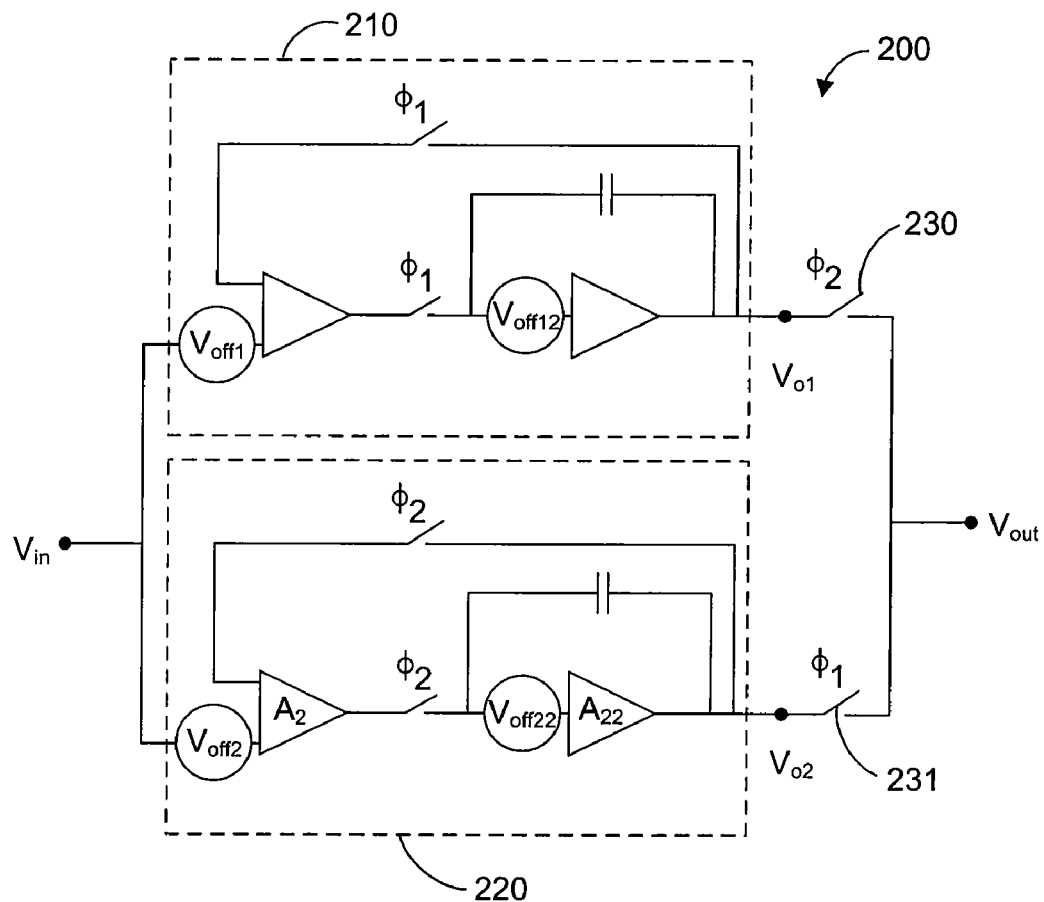
FIG. 2A depicts a track-and-hold circuit comprising two branches of FIG. 1 in parallel.
Figure 3:
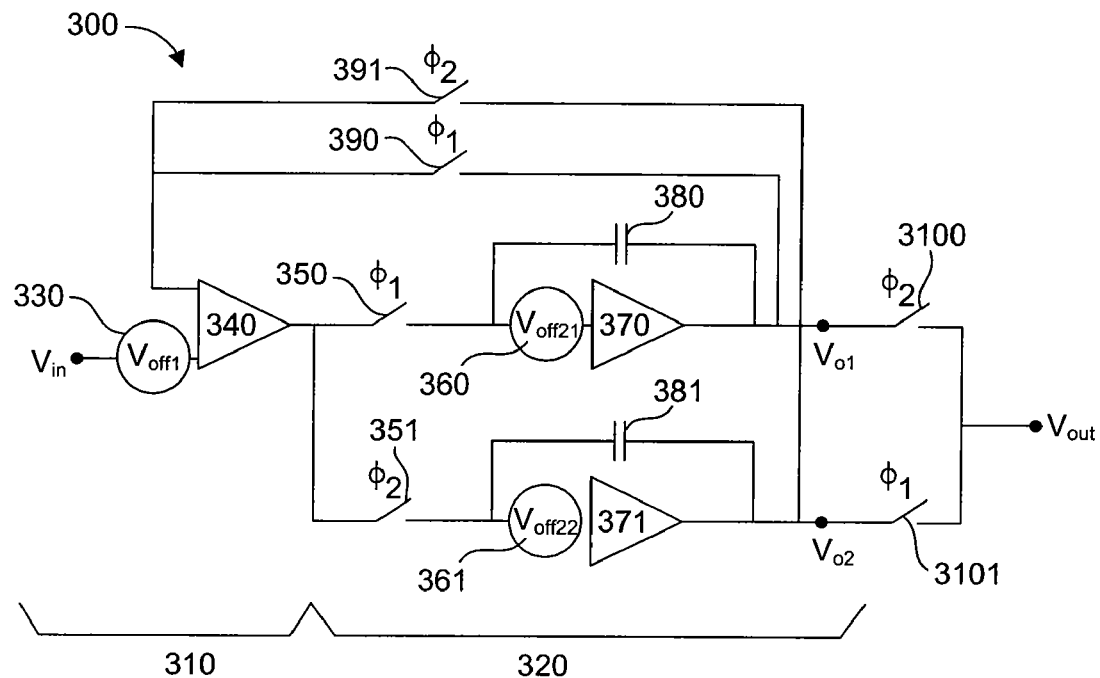
FIG. 3 depicts a first embodiment of a circuit according to the invention.

FIG. 3 schematically depicts a first embodiment of a track-and-hold circuit 300 according to the invention. The circuit comprises one first stage 310 and two second stages 320, wherein the output of the first stage 310 is the input of each second stages 320. The first stages of the individual branches as described with reference to FIG. 2A are thus replaced by one first stage 310, which is shared between the individual second stages 320.

In this embodiment the first stage 310 comprises an operational amplifier 340 having an offset voltage Voff1 due to its non-ideal nature. This offset voltage is exemplified by an offset voltage source 330, which is coupled to an input terminal of the amplifier 340. The input signal Vin is coupled to the offset voltage source and is thus fed forward together with the offset voltage Voff1 into amplifier 340. Note that in other embodiments the first stage may comprise more than one amplifier or amplifying stages, which may be deliberately arranged within the first stage. Accordingly the first stage comprises at least one amplifier or amplifying stage and provides one output signal, which may be amplified or attenuated, and which follows the input signal and may be coupled to subsequent processing stages without affecting the input signal fed into the first stage.

The two second stages 320 are identical and are coupled to the output of the first stage 310, that is the output of amplifier 340, by an individual sampling switch. For example the upper second stage comprises sampling switch 350, an offset voltage source 360 providing an offset voltage Voff21 to the signal, an amplifier 370 and a Miller capacitor 380 for holding a signal amplitude when the sampling switch 350 is open. Similarly the lower second stage comprises a sampling switch 351 coupled to an offset voltage source 361 adding to an offset voltage Voff22 to the signal received from the first stage, an amplifier 371 and a Miller capacitor 381.

The output signal Vo1 of the upper second stage and the output signal Vo2 of the lower second stage are each coupled by a feedback path to the residual input of amplifier 340 of the first stage, wherein each feedback path comprises a switch 390, 391 for decoupling an individual output signal of a corresponding second stage when in hold mode.

Circuit 300 thus provides two output voltages Vo1, Vo2, which may be fed directly into a subsequent analog-to-digital converter—not shown—, if the converter provides corresponding input terminals. Alternatively the output signals may be combined into an overall output signal Vout, wherein each output is coupled/decoupled from the overall output by an individual switch 3100, 3101, when the corresponding second stage is in hold/track mode.

Figure 2B:
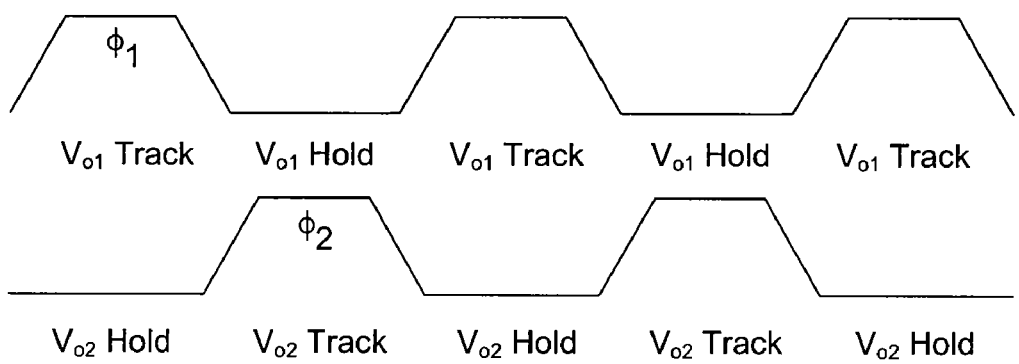
FIG. 2B shows a timing diagram of the clock signals.

As denoted in the drawing by placing the signs φ1, φ2 next to the switches two corresponding clock signals φ1 and φ2 are used for clocking the switches of circuit 300, wherein the clock signals are shaped such that switches triggered by φ1 are open when switches triggered by φ2 are closed and vice versa. Accordingly non-overlapping clock signals φ1, φ2 as illustrated in FIG. 2B can be applied to control switches 350, 351 and 390, 391 and 3100, 3101.

In the first tracking interval signal φ1 is high and switches 350 and 390 are closed accordingly. The input signal Vin is fed through the first stage and the upper second stage hence charging capacitor 380. As long as φ1 is in high state the output signal/voltage Vo1 follows or jumps to the current value of the input signal Vin, so that by the open switch 3100 voltage Vo1 is decoupled from the overall output signal Vout.

As mentioned above in this first interval clock signal φ2 is low while φ1 is high. Accordingly switches 391 and 351 are open thus decoupling the lower second stage from input signal Vin. The amplitude of output signal Vo2 of the lower second stage is defined by the voltage of capacitor 381, which has been charged in the previous tracking interval, that is when φ1 was low and φ2 was high. As switch 3101 is closed in the present—first—interval the overall output signal Vout is defined by Vo2.

In the following interval clock signal φ1 will be low and φ2 will be high, so that switches 351, 391, 3101 will be closed. Hence the upper second stage will be in hold mode and the lower second stage will be in track mode, because switches 350, 390 and 3100 will be open.

Figure 2C:
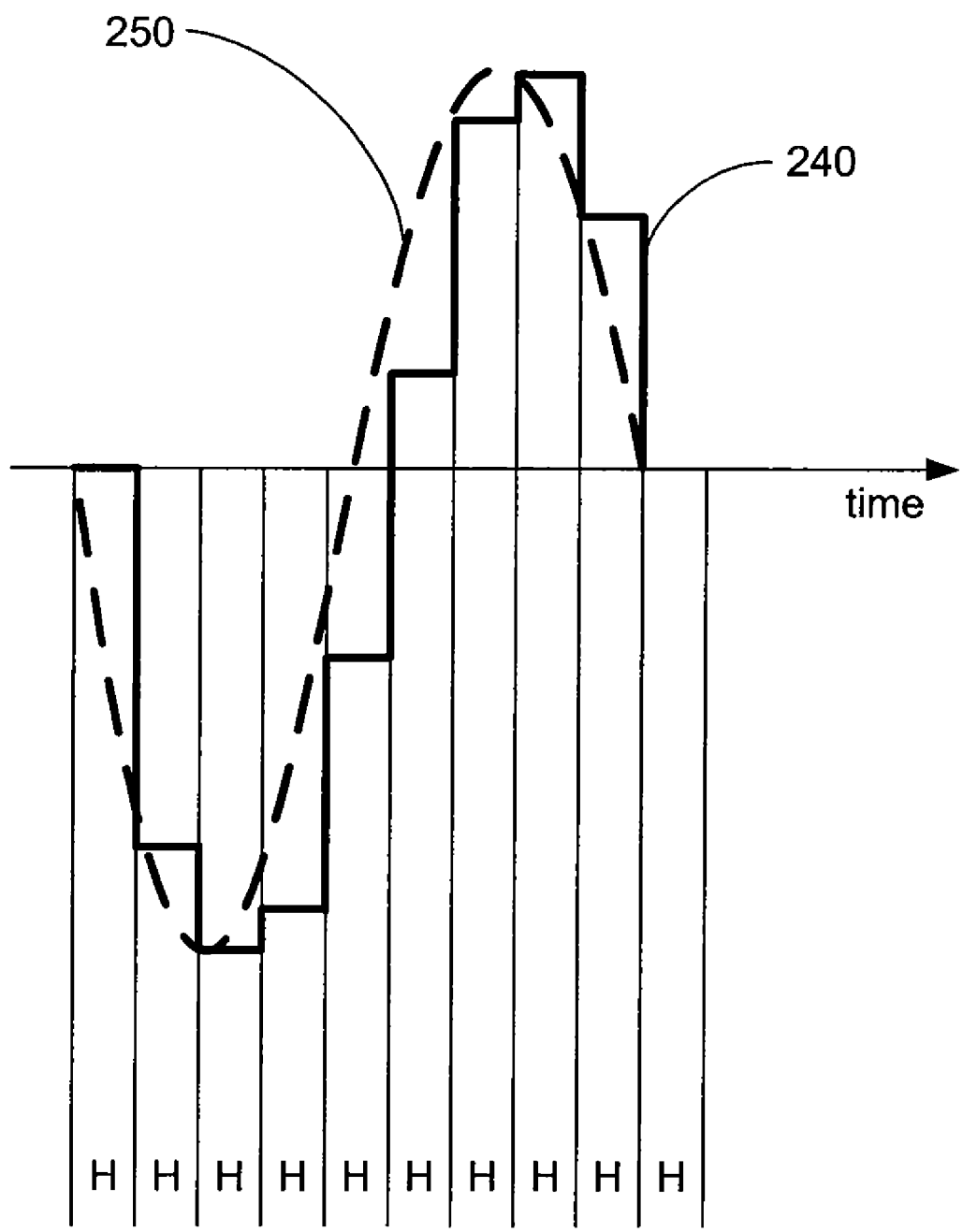
FIG. 2C illustrates the in- and respective output signal.

The output signal Vout of circuit 300 is similar to that depicted in FIG. 2C, because the combination of the one first stage followed by two second stages replaces the function of the two individual branches of FIG. 2A.

In this way only the second stages of circuit 300 are interleaved in time. The first stage is shared by subsequent second stages, as the first stage is needed only for tracking amplitude of the input signal, but idle for all second stages when these are in hold mode. As explicated above interferences caused by different offset voltages Voff21, Voff22 of the second stages are suppressed by the loop gain. In this way only the offset voltage Voff1 of the first stage contributes to the overall offset of the individual second stages, so that by using only one first stage the problem of different offset voltages in the individual branches is solved, because this single offset voltage is constant and does not vary when switching at the sampling frequency between second stages.

Also the second problem, i.e. tones produced by gain errors of the individual feedback paths, is solved, because there is only one feedback path shared between the individual second stages. In one exemplifying embodiment of the invention the feedback path has unity gain.

Figure 4:
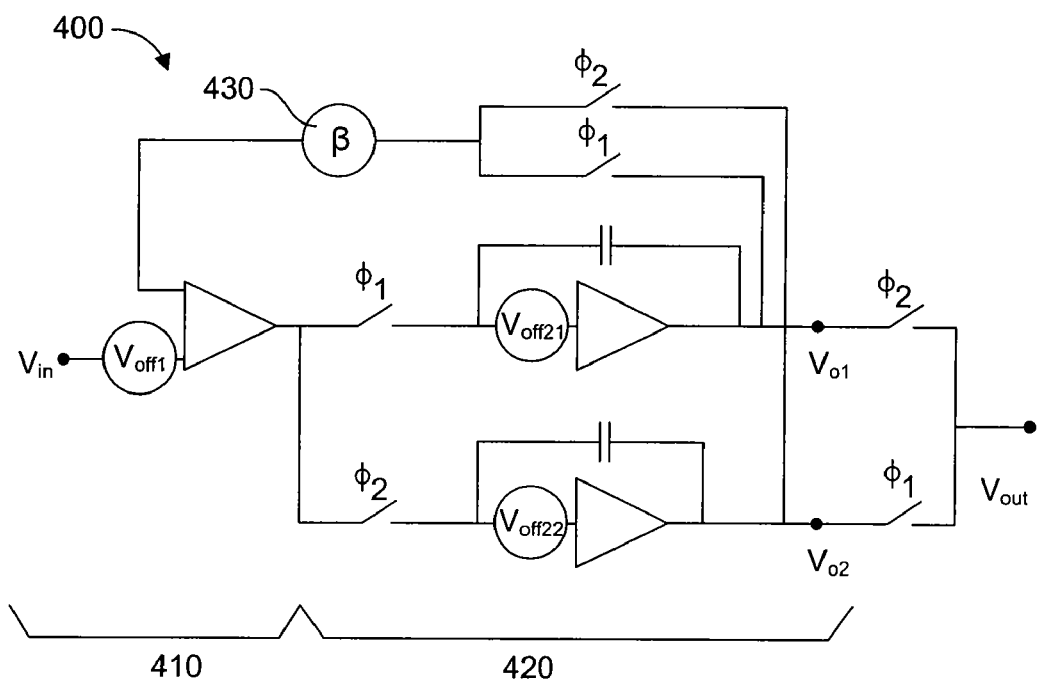
FIG. 4 illustrates a variation of FIG. 3 with non-unity feedback factor.

FIG. 4 illustrates the schematics of circuit 400 illustrating a variation of the first embodiment according to the invention. Similar to the embodiment depicted in FIG. 3 this circuit comprises one first stage 410 and two second stages 420, wherein the first and the second stages comprise the same elements as in FIG. 3. In addition to the first embodiment circuit 400 comprises a means 430 for adjusting the feedback gain of the feedback path, wherein all feedback paths are coupled to said means 430. Accordingly the gain or attenuation factor of said means is the same for all second stages 420.

The means 430 for adjusting the feedback gain or loop gain can be an ohmic resistor introducing a non-unity feedback factor β.

Figure 5A:
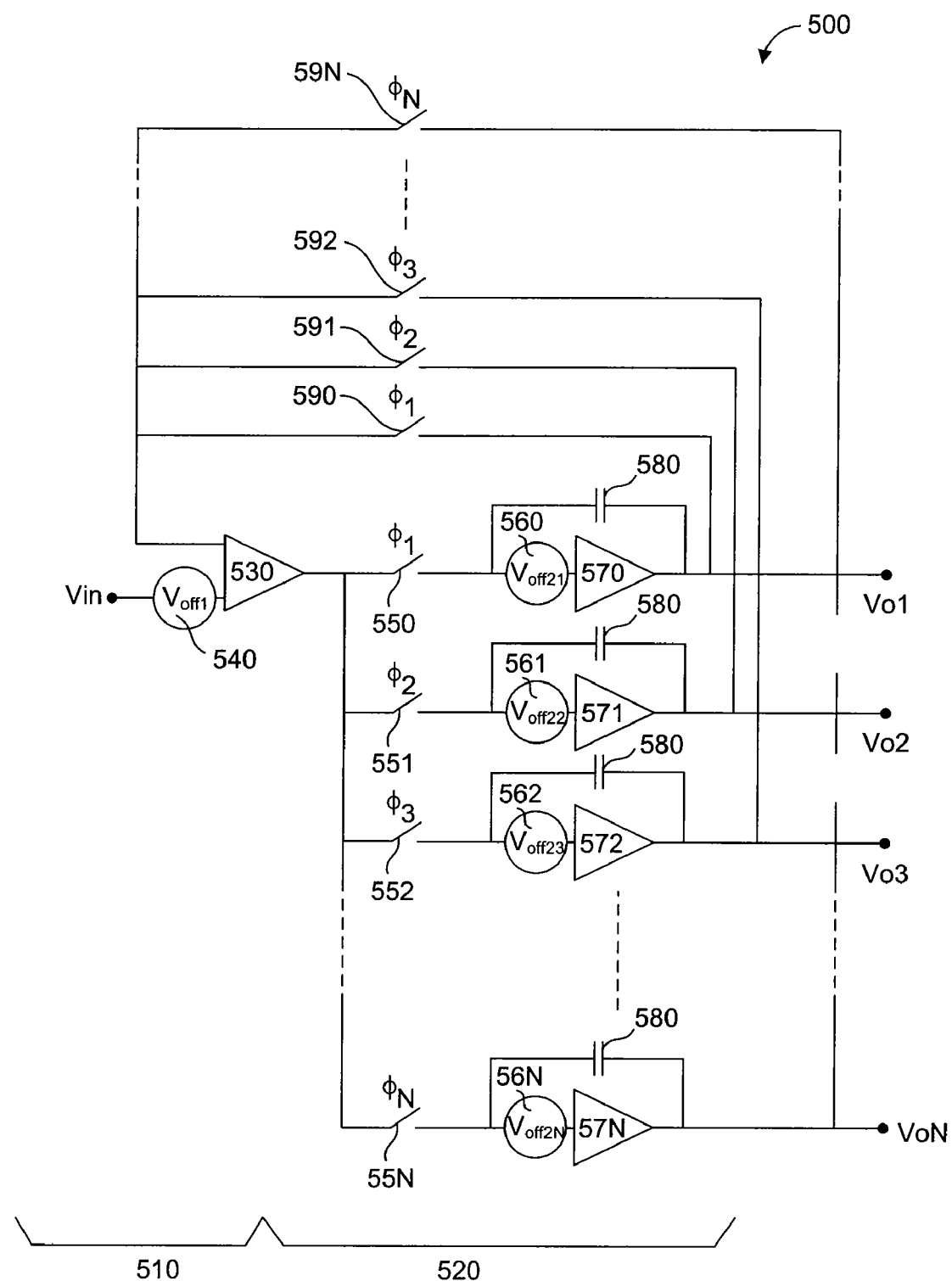
FIG. 5A depicts a circuit comprising N second stages.

FIG. 5A depicts a circuit 500 illustrating a third embodiment of the invention comprising one first stage 510 and a plurality of N second stages 520, which generalizes the idea of the previous embodiments. Similar as in the previous embodiments the one first stage 510 comprises a non-ideal operational amplifier 530, which is coupled to the input signal Vin via offset voltage source 540 with its one input terminal, wherein the offset voltage source adds the offset voltage Voff1 of the operational amplifier 530 to the input signal Vin.

A plurality of N second stages 520 in parallel is coupled to the output of the first stage 510, wherein it is apparent to those skilled in the art that a plurality of N second stages 520 in parallel is coupled to the one input stage as denoted by the dotted lines coupling between the third and the last, N-th second stage. As in the previous embodiments each second stage comprises a non-ideal operational amplifier 570, 571 . . . 57N and a miller capacitor 580, 581 . . . 58N in the feedback path. Second stages 520 are coupled via individual sampling switches 550, 551 . . . 55N to the output of the first stage 510. Each of the second stages further comprises an offset voltage source 560, 561 . . . 56N exemplifying the individual offset voltage of an operational amplifier. The output of each second stage is fed back to the residual input terminal of the first input stage, wherein each of the feedback paths comprises a switch 590, 591, 592 . . . 59N for coupling the output signal of one of the N second stages 520 to first stage.

As mentioned above with reference to the circuit diagram of FIG. 2 switching through parallel sampling branches causes a tone at a frequency of Fs/N, wherein the tone may move into the frequency band of interest. Even if this tone has a small amplitude it introduces distortion into the signal. A solution to reducing this tone is presented later.

Figure 5B:
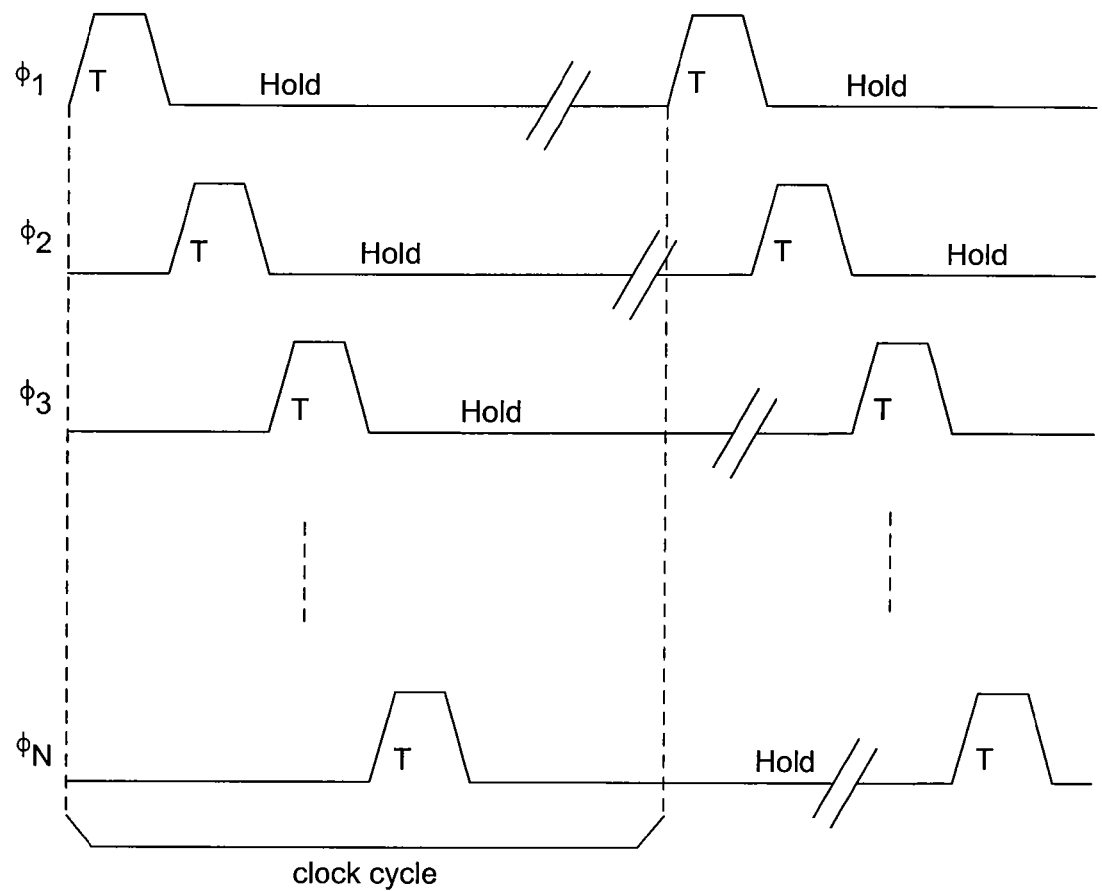
FIG. 5B illustrates the N clock signals for clocking the circuit of A.

FIG. 5B depicts clock signals φ1 to φN for triggering the sampling switches 550 to 55N and the corresponding switches 590 to 59N in the feedback path.

Each of the clock signals φ1 to φN is coupled to the sampling switch 550 to 55N of one second stage and at the same time to the feedback switch 590-59N of that second stage, so that the sampling switch and the feedback switch of one second stage are switched synchronously. Accordingly when, for example, the level of φ2 is high and thus sampling switch 552 is closed to couple amplifier 572 to the first stage, then at the same time feedback switch 592 is closed, such that the output signal of amplifier 572 is fed back to the input of the first stage. When the signal level of φ2 drops, the level of the φ3 rises thus coupling the next second stage to the first stage by closing the appropriate sampling and feedback switches.

The clock signals are thus time interleaved in that a high value of a clock signal begins as soon as the previous clock signal drops to its low value, wherein the first clock signal φ1 succeeds the last φN. Accordingly the second stages are coupled successively to the input signal Vin via the first stage 510 and their output is coupled as feedback input to the first stage 510.

Note that the sequence of switching the output signal from one second stage to the next is deferred by one step than switching to the next second stage. That is, when switching from a second stage n to the next second stage n+1, the output is switched from second stage n−1 to second stage n, because second stage n holds the latest value of the input signal while second stage n+1 will track the input signal.

Again, due to fabrication tolerances the sampling switches and the feedback switches will open and close at slightly different voltages, which causes tones at frequencies of Fs/N+Fin and Fs/N−Fin. The tones avoided by using one shared feedback path may be produced by the switches in the individual second stages.

Figure 6A:
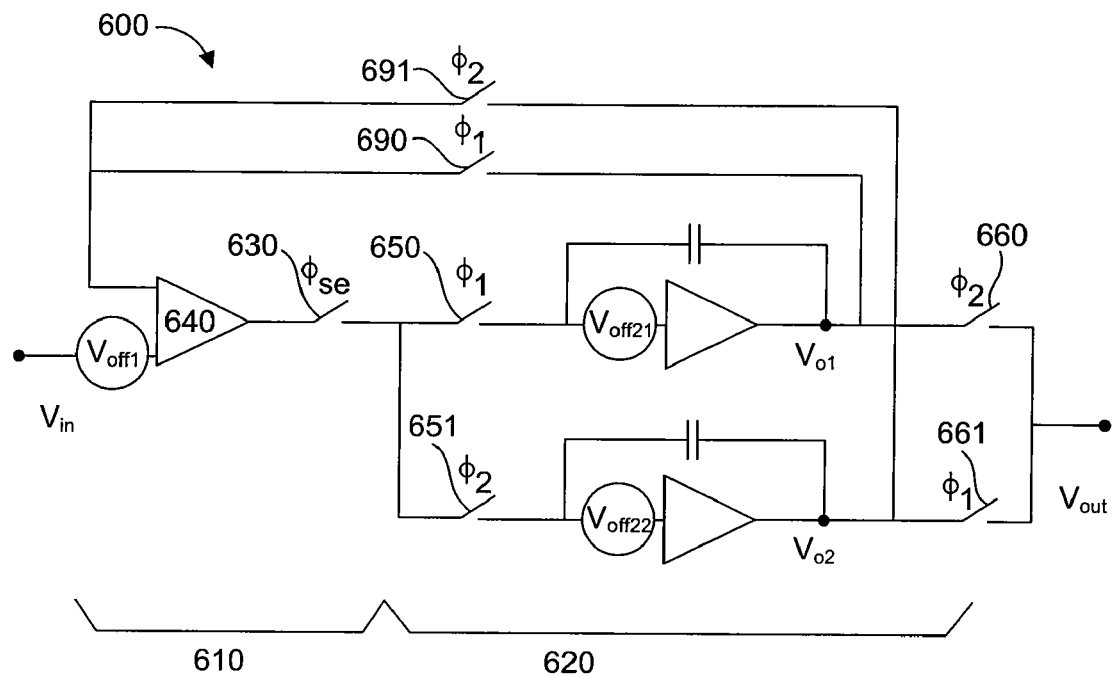
FIG. 6A depicts a circuit comprising an early synchronization switch.

A solution to this problem is presented in FIG. 6A illustrating a circuit 600 comprising one, shared first stage 610 and second stages 620.

Although this embodiment shows only two second stages 620 it is apparent to those skilled in the art that the circuit can be expanded to include N second stages wherein the additional second stages are parallel to the exemplified two second stages.

The second stages 620 are identical to those illustrated in FIGS. 4 and 5.

In order to overcome the problem of non-ideal and therefore slightly different switching sampling switches and correspondingly their slightly different timing in opening and closing, the first stage comprises a synchronization switch 630 arranged between the output of the shared first stage 610, i.e. the output of operational amplifier 640, and the input of the second stages 620.

The purpose of synchronization switch 630 is to open a little early prior to the opening of the sampling switch of the second stage 620 currently in track mode, such that the track mode of second stage is terminated before the sampling switch 650 or 651 opens. Any interferences caused by differences in the opening of the sampling switches 650 or 651 are thus prevented, because effectively there is only one sampling switch for decoupling any second stage currently in track mode.

Figure 6B:
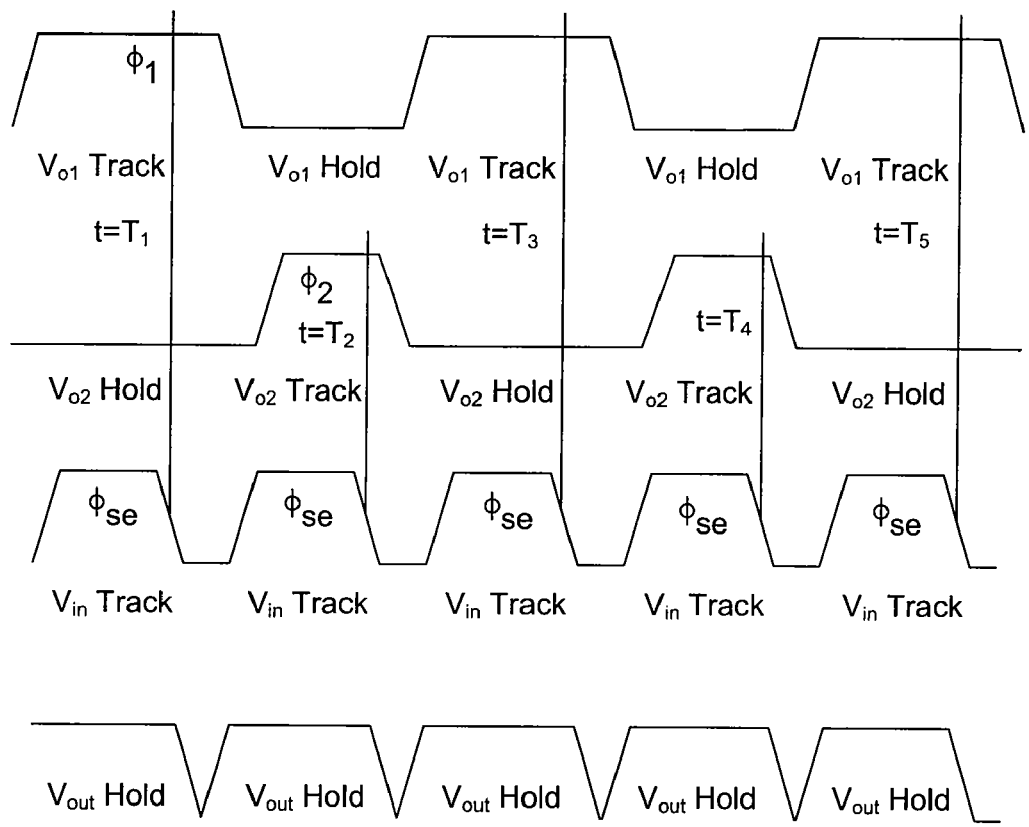
FIG. 6B illustrates the clock signals for clocking the circuit of A.

FIG. 6B illustrates the clock signals φ1 and φ2 of the sampling switches 650, 651, the clocking signal φse of synchronization switch 630 and the output signal Vout.

The clock signals φ1 and φ2 provided to the sampling switches are identical to those illustrated in FIG. 2B, such that the switching of corresponding sampling switches 650, 651 and output switches 660, 661 and feedback switches 690, 691 is identical to that described with reference to FIG. 2.

Clock signal φse illustrates the timing of the synchronization switch 630. As illustrated by the vertical lines t=T1 to t=T5 between clock signal φse and one of the clock signals φ1 or φ2 the falling edge of φse is early to a falling edge of φ1 or φ2, such that signal φse has reached the low level before φ1 or φ2 begins to leave its high level. Accordingly synchronization switch 630 definitely opens before any of the sampling switches 650 or 651, such that sampling switches 650, 651 open an already opened line. Accordingly any effects resulting from different characteristics of switches 650, 651 when opening are eliminated.

The point in time for closing the synchronization switch is less critical, as long as the switch is fully open until the next, selected sampling switch is fully opened. As indicated in the drawing the rising edge of φse is approximately at the time when the next sampling switch closes. If the synchronization switch closes a little early before the next sampling switch closes, then the signal will be fed into the corresponding second stage when the sampling switch closes, because both switches must be closed to couple the signal to a second stage. Consequently in this case the synchronization switch does not have any impact on the next track interval. Vice versa, i.e. when the sampling switch closes before the synchronization switch closes, then the signal flow starts at the closing of the synchronization switch. So in any case the later switch determines the beginning of the signal flow.

As a result of a late synchronization switch the time available for tracking the signal Vin is shortened. However, if the synchronization switch closes shortly after the sampling switch the remaining time usually is long enough to accurately charge the capacitor in the second stage to the level of the input signal, such that this second stage is able to track the input signal accurately. Hence the synchronization switch doesn't have any impact on the accurate tracking of the next second stage and in the next interval.

The synchronization switch 630 in this way opens a little early to each of the sampling switches 650, 651 and decouples the second stage currently in track mode from the first stage, thus avoiding tones at frequencies of Fs/N+Fin and Fs/N−Fin resulting from the different timing of the sampling switches 650, 651.

Furthermore in FIG. 6B the timing of the overall output signal Vout is illustrated. It is apparent that the illustrated amplitude serves as an example having the same value, but in reality may have different amplitude values following those of the input signal Vin. As the clock signals of the output switches 660, 661 is that of the sampling switches 650, 651, but shifted by one, the overall output signal is coupled to the second stage, which tracked the input signal last. Accordingly the introduction of the synchronization switch does not affect the waveform of the overall output signal. The overall output signal is thus similar to that as shown in FIG. 2B. That is the overall output signal Vout always reflects the value of the input value as tracked in the last tracking interval, wherein the time needed for switching is that of output switches 660, 661.

Figure 7:
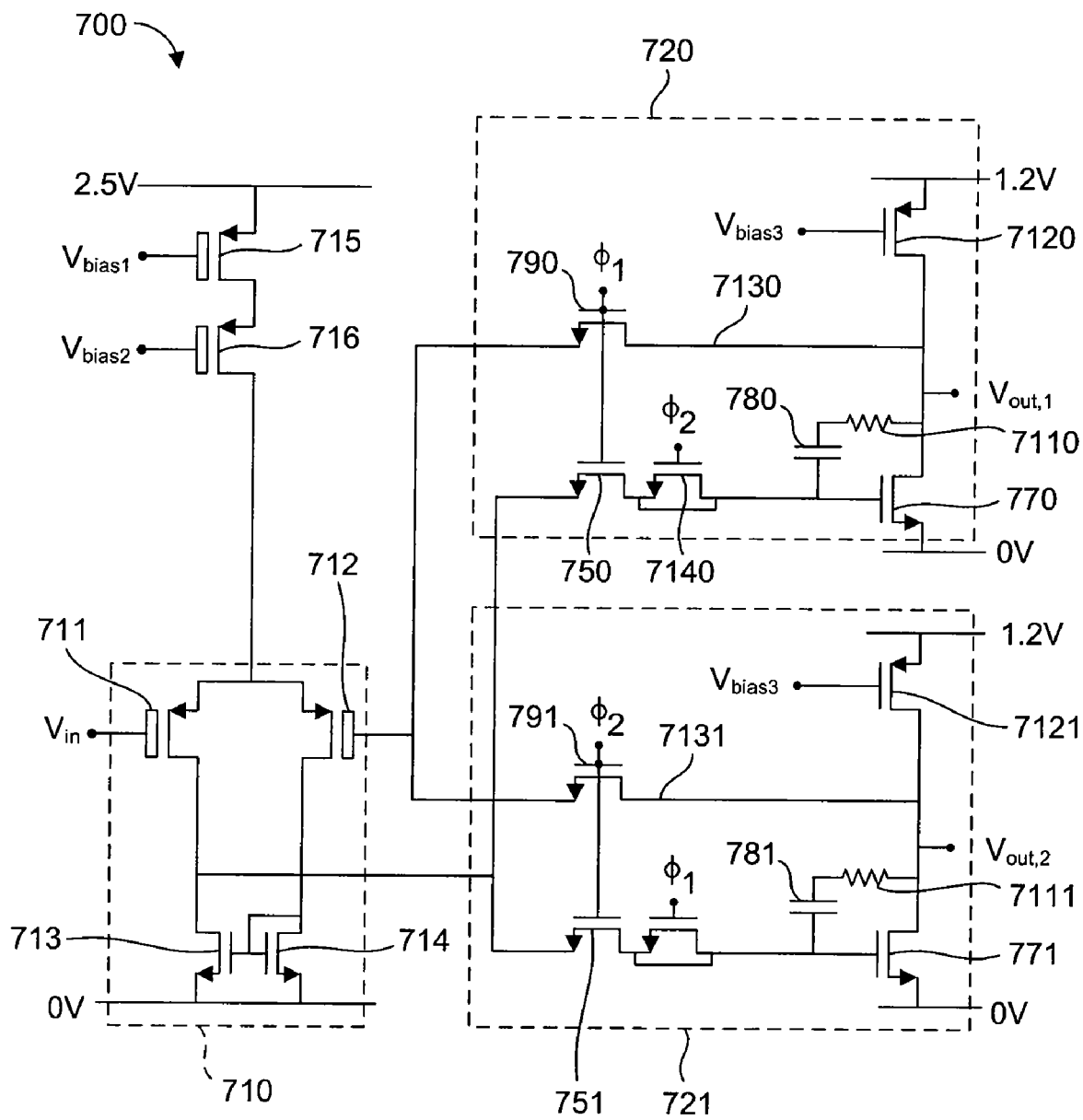
FIG. 7 illustrates an exemplary implementation of a circuit with two second stages.

FIG. 7 illustrates an electrical circuit 700 exemplifying the simplest implementation of the invention with two second stages and accordingly two separate outputs, which corresponds to the embodiment as illustrated in FIG. 4, but without output switches for coupling the output signals of the second stages to one overall output.

The first stage 710 of the circuit, as encircled by the dotted rectangle, comprises a first and a second thick oxide PMOS transistor 711 and 712 respectively and two standard NMOS transistors 713 and 714. Transistors 711 and 712 form the operational amplifier of the first stage and can be chosen as thick oxide transistors in order to handle input signals of higher voltages, for example up to 2.5 Volts. The input signal Vin to be processed is coupled to the gate of transistor 711, which forms one input terminal of the operational amplifier in the first stage. The gate of transistor 712 forms the second input terminal of the operational amplifier comprised in the first stage 710.

First stage 710 is powered by two, preferably thick oxide PMOS transistors 715, 716 coupled to a supply voltage of for example 2.5 Volts and appropriately biased by voltages Vbias1 and Vbias2, which ensure that an appropriate current is supplied to the first stage 710, namely to the transistors 711, 712, which form the operational amplifier.

A first second stage 720, as encircled by a dotted line, comprises an operational amplifier 770 having a miller capacity 780 and a resistor 7110 in its feedback path. Reference sign 7120 denotes a PMOS transistor coupled to a supply voltage of 1.2 Volts and biased appropriately to supply a constant current to the amplifier. The output voltage Vout1 is coupled via feedback path 7130 to the second input terminal of the operational amplifier in the first stage. In this way the output signal Vout1 of the first second stage is fed back to the first stage 710. In this embodiment the maximum swing of the output signal Vout1 is thus limited by the supply voltage provided to transistor 7120, i.e. the maximum signal swing of signal Vout1 is 1.2 Volts. It is apparent to those skilled in the art that the maximum output voltage can be easily adapted to other voltages, i.e. for example higher voltages, by adapting the supply voltage of transistor 7120 and by suitable adapting the semiconductor elements to the other voltage.

Second stage 720 furthermore comprises sampling switch 750 to couple/decouple the input of the first second stage to/from the output of the first stage 710 and comprises switch 790 in the feedback path to couple/decouple the output signal Vout1 of the stage to/from the input of the first stage corresponding to clock signal $\phi1$.

In addition to those elements corresponding to the elements in FIG. 3 first second stage 720 comprises an NMOS transistor 7140, whose drain is short-circuit to its source. The drain of transistor 7140 is coupled to the source of sampling transistor 750. Transistor 7140 is designed to have half the size of transistor 750, i.e. half the channel width of transistor 750. Accordingly the charge resulting from any switching operation in transistor 7140 is half the size of the charge emitted from transistor 750. As shown in the drawing transistor 7140 is controlled by clock signal $\phi2$ and transistor 750 is controlled by $\phi1$. As the clock signals $\phi1$ and $\phi2$ are complementary to each other, transistor 750 switches to its open state when transistor 7140 switches to its closed state. The charge output by transistor 750 in this way is compensated by the charge output by transistor 7140 and thus does not have impact on the charge stored on the miller capacitor 780. Transistor 7140 thus works as a charge compensator.

Also in addition to the circuit of FIG. 2 a resistor 7110 is in line with the miller capacitor 780 in order to limit the forward path conductivity around transistor 770 introduced by the miller capacitor.

The second stage 721 of course comprises like elements, wherein transistor 751 and switch 791 in the feedback path are controlled by clock signal $\phi2$, whereas transistor 7121 is controlled by $\phi1$.

The feedback paths 7130, 7131 of the second stages 720 and 721 provide unity gain, which suppresses gain variations that otherwise might occur when switching between second stages.

Figure 8:
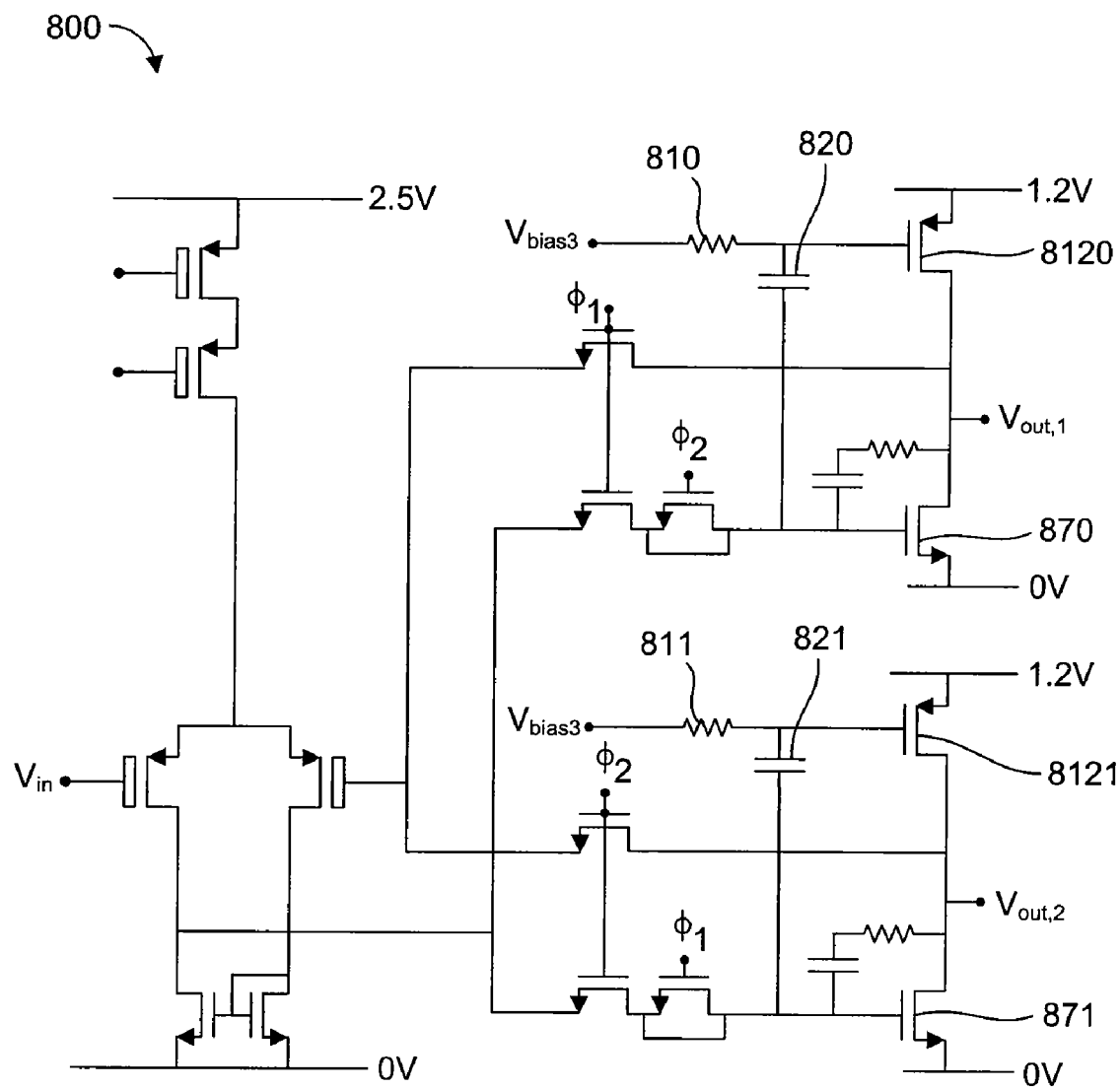
FIG. 8 depicts a modification of the circuit of FIG. 7.

Circuit 800 as shown in FIG. 8 differs from circuit 700 in that a resistor 810 and 811 respectively and capacitors 820, 821 respectively have been added to the second stages.

As illustrated in the drawing resistors 810, 811 are arranged between the power supply biased by Vbias3 and the transistor 8120, 8121. Capacitors 820, 821 are arranged to form an RC element with resistors 810, 811. Capacitors 820, 821 couple the input of the operational amplifier transistors 870, 871 to the gate of transistors 8120, 8121. The dimensions of the RC elements are chosen such that they are conductive for high frequencies. The capacitor effects that the output signal Vout1, Vout2 of a second stage is pulled up quickly when the input of the operational amplifier in the second stage, i.e. the gate of transistor 870, 871 is negative. In this way resistors 810, 811 and capacitors 820, 821 respectively enhance the operation of the second stages.

Figure 9:
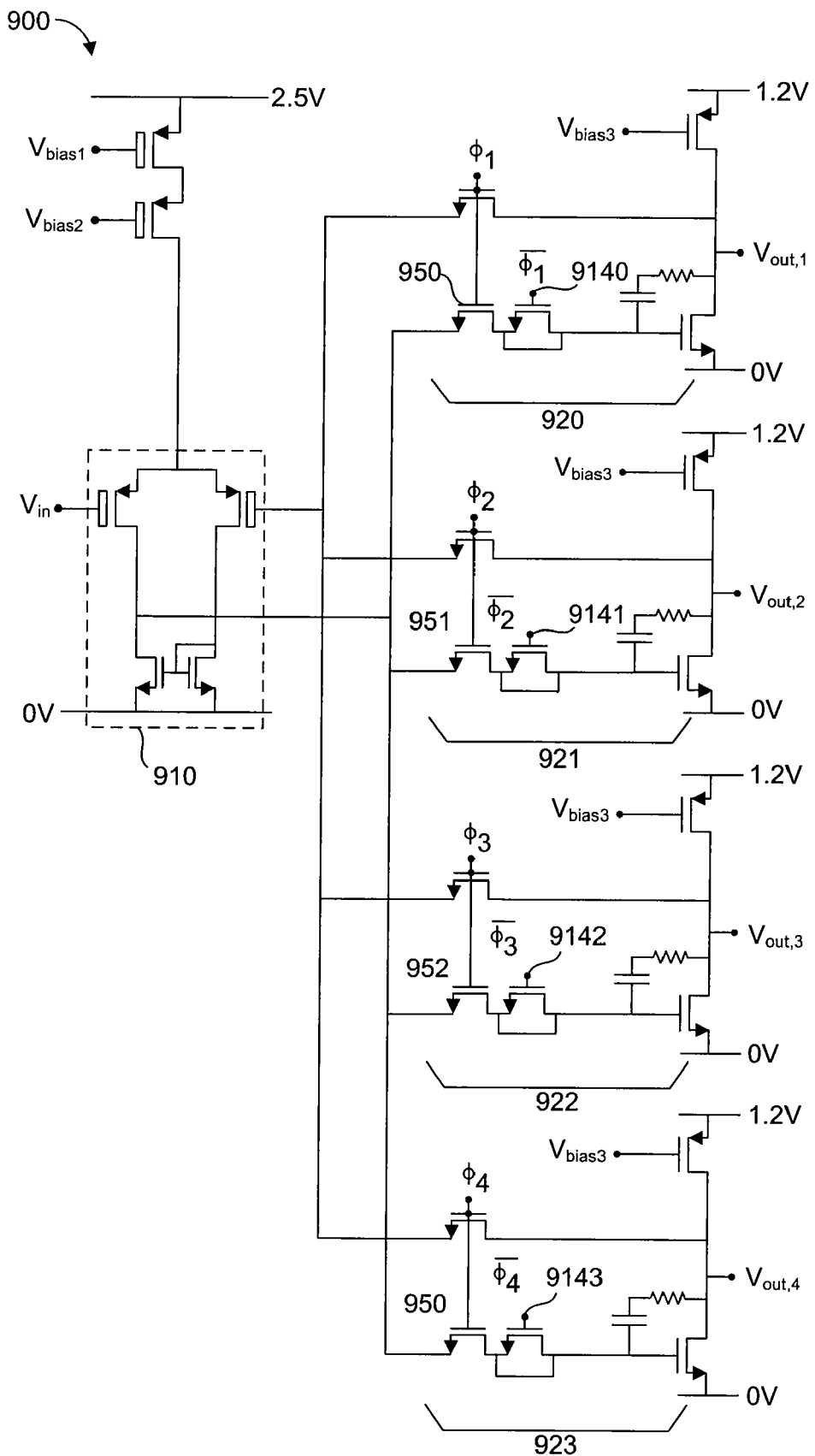
FIG. 9 depicts an exemplary implementation comprising four second stages.

FIG. 9 depicts an exemplary implementation 900 of a track and hold amplifier circuit according to the invention comprising one first stage 910 and four second stages 920 to 923, wherein the first stage 910 is identical to that of FIG. 7 and each of the second stages comprises the elements as described for a second stage of FIG. 7. Also as described afore charge compensating transistors 9140 to 9143 are controlled by a signal being complementary to that controlling the adjacent sampling switch transistors 950 to 953. That is, for example, sampling switch transistor 951 is controlled by clock signal $\phi2$ and transistor 9141 is controlled by a signal not$\phi2$ being complementary to $\phi2$, such that transistors 951 and 9141 are switched contrarily.

Although this embodiment depicts four second stages 920 to 923 coupled to one shared first stage 910, it is apparent for those skilled in the art that the circuit can easily be extended to N second stages in N parallel branches.

Figure 10A:
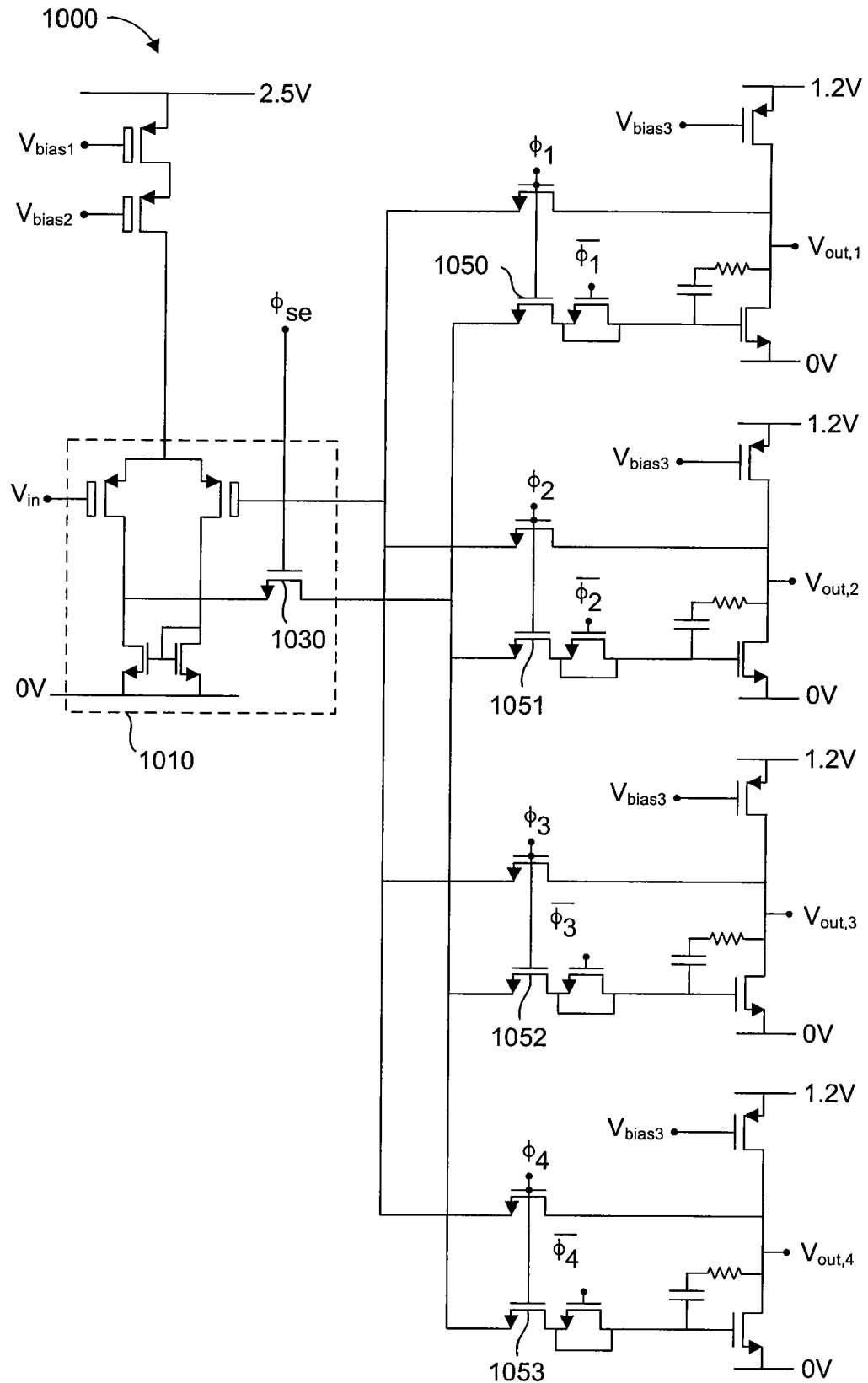
FIG. 10A depicts an exemplary implementation comprising four second stages and a synchronization switch in the first stage.

FIG. 10A depicts an example of an implementation of a track and hold circuit 1000 similar to that of FIG. 8 comprising one first stage 1010 and four second stages 1020 to 1023, but wherein the first stage 1010 comprises a synchronization switch. In this embodiment the synchronization switch 1030 is an NMOS transistor controlled by a clock signal $\phi$se. Similar as described with reference to FIG. 6 synchronization switch 1030 always opens a bit early with respect to the sampling switch of the next second stage coupled to the shared first stage.

Figure 10B:
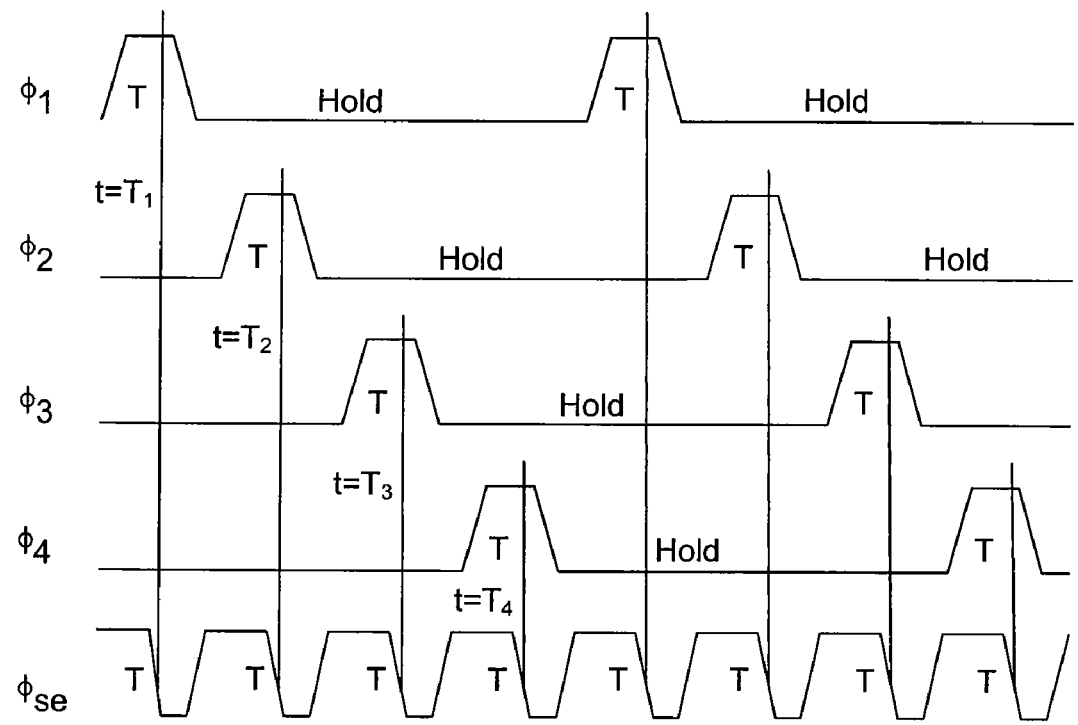
FIG. 10B depicts corresponding clock signals φ1 to φ4 and φse.

FIG. 10B exemplifies a timing diagram showing clock signals $\phi1$ to $\phi4$ and $\phi$se controlling sampling switch transistors 1050 to 1053 and synchronization switch transistor 1030. Similar as described with reference to FIG. 6B the falling edge of clock signal $\phi$se always starts a little early before one of the clock signals $\phi1$ to $\phi4$ controls the corresponding sampling switch transistor to switch from a track phase to a hold phase. That is, for example at point in time t=T1 the falling edge of clock signal $\phi$se is a little early to clock signal $\phi1$, so that synchronization switch transistor 1030 opens before sampling switch transistor 1050 opens. Similarly at points in time t=T2, t=T3 and t=T4 the falling edge of clock signal $\phi$se is a little early to the falling edge of clock signals $\phi2$, $\phi3$ and $\phi4$ respectively.

Figure 11:
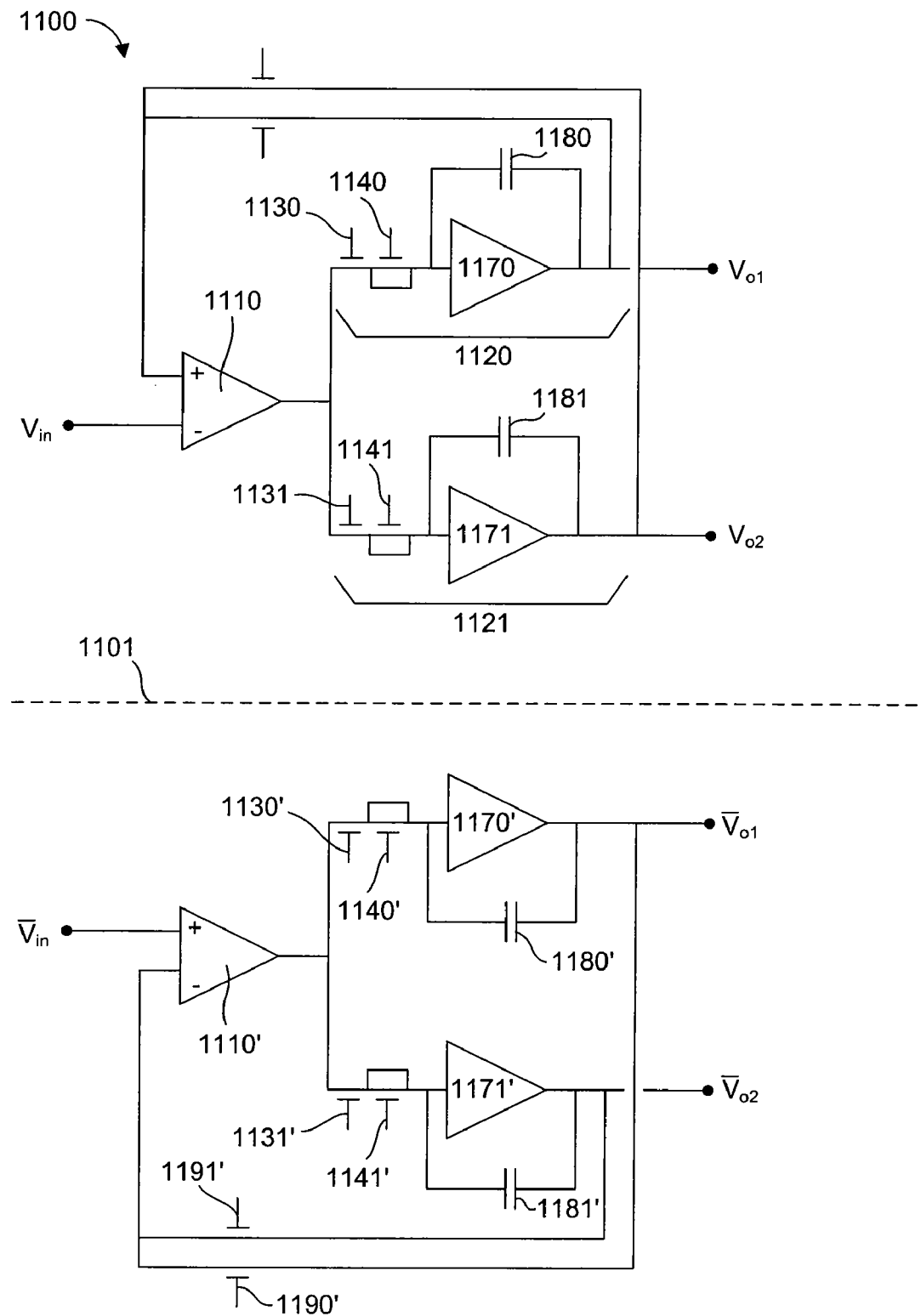
FIG. 11 depicts a schematic of a differential implementation.

FIG. 11 schematically depicts a differential implementation of a track and hold circuit 1100 for processing a differential signal having a non-inverted signal Vin and an inverted signal not-Vin. Reference numeral 1101 denotes the mirror line between the two identical circuit portions. The non-inverting branch of this differential circuit is illustrated in the upper portion of the drawing, i.e. above mirror line 1101, and the inverting branch is shown in the lower portion. In this embodiment both the non-inverting and the inverting branch each comprise one shared first stage and two second stages.

The first stage of the non-inverting branch comprises an operational amplifier 1110.

Second stages 1120 and 1121 of the non-inverting branch each comprise a sampling switch transistor 1130, 1131, a charge compensating transistor 1140, 1141, an operational amplifier 1170, 1171 with a miller capacitor in the feedback path around the amplifiers 1170 and 1171 respectively and a switch in the feedback path to the first stage 1190, 1191 respectively.

As the inverting branch of this embodiment comprises identical elements, these are not explicitly listed are. In the drawing they are denoted with same reference numbers as used for the non-inverting branch, but with an additional '.

Although not drawn it is apparent to those skilled in the art that amplifiers 1110, 1170 and 1171 respectively each introduce an individual offset voltage due to their non-ideal nature.

The non-inverting as well as the inverting branch are thus each identical to the circuit shown in FIG. 7, except that in this embodiment the power supply details are not shown.

Accordingly it is apparent that the sampling switch transistor 1130, transistor 1190 and charge compensating transistor 11141 are controlled by a first clock signal $\phi1$ and sampling switch transistor 1131, transistor 1191 and charge compensating transistor 1140 are controlled by a clock signal φ2 being complementary to clock signal φ1. The switching transistors in the inverting branch are controlled with identical signals.

Circuit 1100 thus shows a differential implementation of a track and hold amplifier circuit for processing a differential input signal, which provides corresponding output signals.

Figure 12:
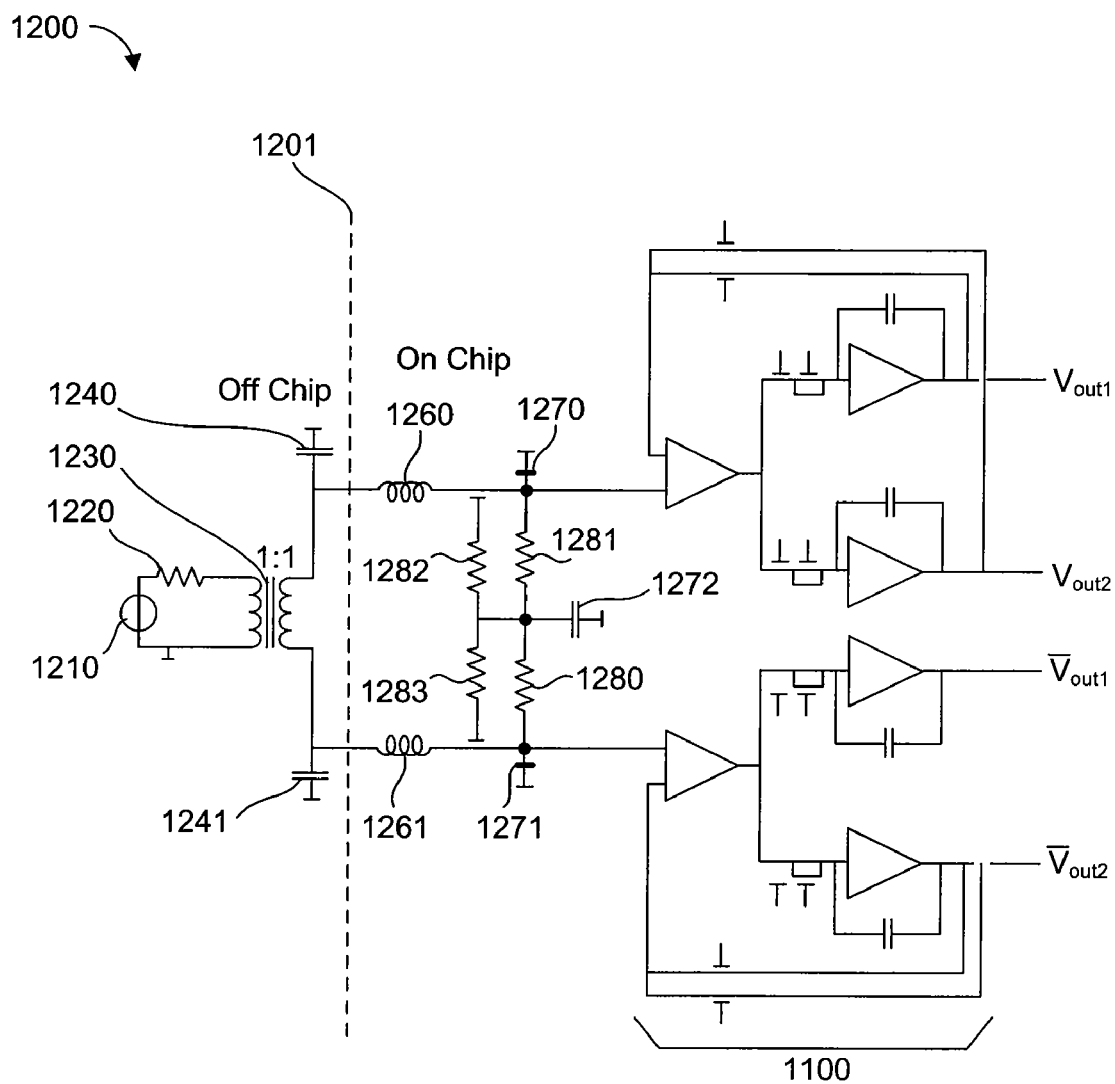
FIG. 12 depicts the circuit of FIG. 11 with peripheral elements as used on a chip.

FIG. 12 depicts a circuit 1200 comprising a differential track and hold circuit 1100 as shown in FIG. 11, which has been implemented on a printed circuit board, i.e. a chip. Dotted line 1201 shows the borderline of the chip.

On the off-chip side a simple circuit for generating a differential signal is illustrated. A source 1210 provides a non-differential signal, which is coupled via resistor 1220 to a transducer 1230. The output terminals of transducer 1230 are coupled via a first and a second capacitor 1240, 1241 to ground. The output of transducer 1230 provides a signal, which is the differential signal corresponding to that of source 1210.

The differential signal is coupled to a first and a second terminal 1250, 1251 to the chip. The terminals 1250, 1251 are bonded with bond wires to the inner circuits of the chip. These bond wires each introduce an unwanted inductance. Correspondingly the bond wires are illustrated as inductances 1260 and 1261, which cause a high input impedance of the chip for high frequencies.

For compensating the high input impedance capacitors 1270, 1271, 1272 and resistors 1280 to 1283 are added to the differential input path of the chip. The differential input signal is then coupled to the input terminals of the first stages of the differential track and hold circuit 1100.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed.

What is claimed is:

1. A track-and-hold circuit configured to provide discrete values of an input signal at its output, comprising:
   a first stage configured to amplify the input signal to provide one output signal;
   a first second stage configured to track the one output signal during a first clock phase and to provide discrete values of the one output signal during a second clock phase;
   a second second stage configured to track the one output signal during the second clock phase and to provide the discrete values of the one output signal during the first clock phase; and
   a synchronization switch configured to couple the first stage to the first second stage and the first stage to the second second stage and to decouple the first stage from the first second stage and the first stage from the second second stage.

2. The track-and-hold circuit of claim 1, wherein the first second stage includes a first sampling switch coupled to the output of the first stage to track the one output signal during the first clock phase and the second second stage includes a second sampling switch coupled to the output of the first stage to track the one output signal during the second clock phase.

3. The track-and-hold circuit of claim 1, wherein each of the first second stage and the second second stage includes an amplifier and a storage element for holding the discrete values of the one output signal.

4. The track-and-hold circuit of claim 3, wherein the storage element is a miller capacitor.

5. The track-and-hold circuit of claim 3, wherein the first second stage comprises:
   a biased transistor configured to provide a supply voltage to the amplifier of the first stage, and wherein a gate of the transistor is coupled by a capacitor to an input of the amplifier of the first stage.

6. The track-and-hold circuit of claim 1, wherein the discrete values of the one output signal provided by the first second stage are combined with the discrete values of the one output signal provided by the second second stage to provide the discrete values of the input signal.

7. The track-and-hold circuit of claim 1, wherein the track-and-hold circuit is constructed and arranged such that the one output signal of the first second stage is fed back to the first stage during the first clock phase to provide a first feedback path and the one output signal of the second second stage is fed back to the first stage during the second clock phase to provide a second feedback path.

8. The track-and-hold circuit of claim 7, wherein at least one of the first feedback path and the second feedback path includes an attenuating element.

9. The track-and-hold circuit of claim 8, wherein the attenuating element is a resistor.

10. A track-and-hold circuit configured to provide discrete values of an input signal at its output, comprising:
    a first stage configured to amplify the input signal to provide one output signal;
    a first second stage configured to track the one output signal during a first clock phase and to provide discrete values of the one output signal during a second clock phase, the first second stage including a first sampling switch coupled to the output of the first stage to track the one output signal during the first clock phase; and
    a second second stage configured to track the one output signal during the second clock phase and to provide the discrete values of the one output signal during the first clock phase, the second second stage including a second sampling switch coupled to the output of the first stage to track the one output signal during the second clock phase,
    wherein the first sampling switch includes a first transistor and the first second stage comprises a second transistor in line with the first transistor with a short-cut source-drain path, the second transistor being configured to switch complementary to the first transistor.

11. The track-and-hold circuit of claim 10, wherein the first and second transistors are NMOS and the second transistor is half the size of the first transistor.

12. A method for providing discrete values of an input signal, the discrete values including a first portion and a second portion comprising:
    (a) using a first stage to decouple the input signal to provide one output signal;
    (b) tracking the one output signal during a first clock phase using a first second stage to provide a first tracked value;
    (c) holding the first tracked value during a second clock phase to provide the first portion of the discrete values of the input signal;
    (d) tracking the one output signal during the second clock phase using a second second stage to provide a second tracked value;
    (e) holding the second tracked value during the first clock phase to provide the second portion of the discrete values of the input signal; and (f) decoupling the first stage from the first second stage and the second second stage before the first second stage or the second second stage begins to hold the first tracked value or the second tracked value, respectively.

13. The method of claim 12, wherein step (b) comprises:
(b)(i) feeding the one output signal back from a second stage to the first stage.

14. The method of claim 13, wherein step (b)(i) comprises:
(b)(i)(A) attenuating the one output signal.

15. The method of claim 13, wherein step (d)(i) comprises:
(d)(i)(A) attenuating the one output signal.

16. The method of claim 12, wherein step (d) comprises:
(d)(i) feeding the one output signal to the first stage.

\* \* \* \* \*

UNITED STATES PATENT AND TRADEMARK OFFICE
CERTIFICATE OF CORRECTION

PATENT NO. : 7,545,296 B2  Page 1 of 1
APPLICATION NO. : 11/843341
DATED : June 9, 2009
INVENTOR(S) : Bult et al.

It is certified that error appears in the above-identified patent and that said Letters Patent is hereby corrected as shown below:

Column 12, line 54, "second portion comprising" should be replaced by -- second portion, comprising --.

Signed and Sealed this

Sixth Day of October, 2009

David J. Kappos
*Director of the United States Patent and Trademark Office*